United States Patent [19]
Bradley

[11] Patent Number: 5,400,026
[45] Date of Patent: Mar. 21, 1995

[54] FLASH ANALOG-TO-DIGITAL CONVERTER EMPLOYING JOSEPHSON JUNCTIONS

[75] Inventor: Paul D. Bradley, Pleasantville, N.Y.

[73] Assignee: Hypres, Inc., Elmsford, N.Y.

[21] Appl. No.: 110,389

[22] Filed: Aug. 23, 1993

[51] Int. Cl.[6] .......................................... H03M 1/12
[52] U.S. Cl. .................................... 341/133; 341/155
[58] Field of Search ............... 341/133, 155, 158, 159; 505/827

[56] References Cited

U.S. PATENT DOCUMENTS

| | | | |
|---|---|---|---|
| 4,977,402 | 12/1990 | Ko | 341/133 |
| 5,192,951 | 3/1993 | Ko | 341/133 |
| 5,248,941 | 9/1993 | Lee et al. | 505/846 X |

*Primary Examiner*—Brian K. Young
*Attorney, Agent, or Firm*—Henry I. Schanzer

[57] ABSTRACT

The invention includes an edge-triggered comparator circuit comprising a first Josephson junction connected between a signal input node and an output node and a sampler network coupled to the output node. The first Josephson junction is part of a low inductance SQUID which exhibits a periodic transfer function whose periodicity is a function of the current injected into the SQUID. The sampler network includes a second Josephson junction connected between a sampling terminal and the output node and a third Josephson junction connected between the output node and a point of reference potential. "N" comparator circuits embodying the invention may be interconnected to form an "N"-bit flash analog-to-digital (A/D) converter. The A/D converter may include an R-2R resistive ladder network connected between an analog signal input terminal and a point of reference potential. The resistive ladder network has N nodes with a different comparator being connected to each node. The signal current flowing along the resistive network is divided down by the ladder network such that the current flowing into each succeeding comparator is one-half the current flowing into the preceding comparator. In A/D circuits embodying the invention, there is included an "on chip" step generator circuit responsive to an external sampling signal for producing a sampling step signal having a very short rise time. The sampling step signal is applied to the sampling terminal of all the comparators via circuitry designed to ensure that all the comparators are driven with essentially the same type of step signal.

15 Claims, 7 Drawing Sheets

The single junction SQUID

Four Bit Gray Code

FLASH ANALOG-TO-DIGITAL CONVERTER EMPLOYING JOSEPHSON JUNCTIONS

BACKGROUND OF THE INVENTION

This invention relates to flash analog-to-digital (A/D) converters and, in particular, to superconductive flash A/D converters employing Josephson junctions.

Josephson junctions have a current-voltage (I-V) characteristic of the type shown in FIG. 1 and, for ease of illustration, in the appended drawings, Josephson junctions are shown by an "X". Initially, prior to being powered, each Josephson junction is in a "superconductive" state (S-state) and functions as a short circuit, i.e., it's resistance [and/or impedance] is zero. A Josephson junction remains in the S-state until the current through the Josephson junction exceeds the critical current (Ic) of the device. When the critical current (Ic) of the Josephson junction is exceeded, the device is then switched to what is termed the "normal" state (N-state). In going from the "S" state to the "N" state, the characteristic of the device changes abruptly as shown in FIG. 1. In the "S" state, a Josephson junction exhibits zero impedance and zero voltage drop for current through the device below the critical current (Ic) of the device. In the "normal" state which may also be termed the "voltage" or "resistive" state, the Josephson junction exhibits a very high impedance for voltages of less than, for example, 2.5 millivolts and somewhat lower but still significant impedance for voltages in excess of, for example, 2.5 millivolts applied or developed across the Josephson junction.

A superconducting quantum interference device (SQUID) is a circuit which includes one or more Josephson junctions and one or more inductive loads. A single junction SQUID includes the combination of a single Josephson junction connected across an inductance, as shown in FIG. 2A. A current may be injected into one end of the inductance and Josephson junction combination, and the other end of the combination may be returned to ground or some point of reference potential.

A very significant property of the single junction SQUID, from the stand point of A/D conversion, is to be found in the relationship between the magnetic flux in the SQUID and the value of the injected current. As shown in FIG. 2B, the SQUID exhibits a periodic transfer function. The output periodicity of the transfer function, which may be represented as a somewhat "skewed" sine wave, is a function of the amplitude of the current injected in the SQUID. Furthermore, the periodicity of the transfer function doubles when the current through the SQUID doubles. This property of the single junction SQUID is used in the design and operation of A/D converters embodying the invention.

In known superconductive A/D designs, several high speed signals are necessary to operate the circuit. Many of these signals also require amplitude levels precise to one part in $2^n$ for an n-bit converter. At frequencies above $10^9$ Hz, this becomes difficult and expensive to control due to the high cost of the microwave equipment necessary to allow independent adjustment of all these signal levels with precision. These problems are avoided in circuits embodying the invention.

SUMMARY OF THE INVENTION

Circuits embodying the invention include a comparator circuit comprising a first Josephson junction connected between a signal input node and an output node and a sampler network coupled to the output node. The first Josephson junction is part of a low inductance superconductive quantum interference device (SQUID) which exhibits a periodic transfer function whose periodicity is a function of the current injected into the SQUID. The sampler network includes a second Josephson junction connected between a sampling terminal and the output node and a third Josephson junction connected between the output node and a point of reference potential.

"N" comparator circuits embodying the invention may be interconnected to form an "N"-bit flash analog-to-digital (A/D) converter. The A/D converter may include an R-2R resistive ladder network connected between an analog signal input terminal and a point of reference potential. The resistive ladder network has N nodes with each node being connected to a different one of the N comparators. The signal current flowing along the resistive network is divided down by the ladder network such that the current flowing into each succeeding comparator is one-half the current flowing into the preceding comparator.

In A/D circuits embodying the invention, there is included a step generator circuit responsive to an external sampling signal for producing a sampling step signal having a very short rise time. The sampling step signal is applied to the sampling terminal of all the comparators via circuitry designed to ensure that all the comparators are driven by essentially the same type of step signal.

A particular aspect of A/D converters embodying the invention is the combination of an edge-triggered comparator which includes a low inductance SQUID with an "on-chip" regulated step generator to define the sampling instant.

BRIEF DESCRIPTION OF THE DRAWINGS

In the accompanying figures, like reference characteristics denote like components.

DETAILED DESCRIPTION OF THE INVENTION

Figure 3:
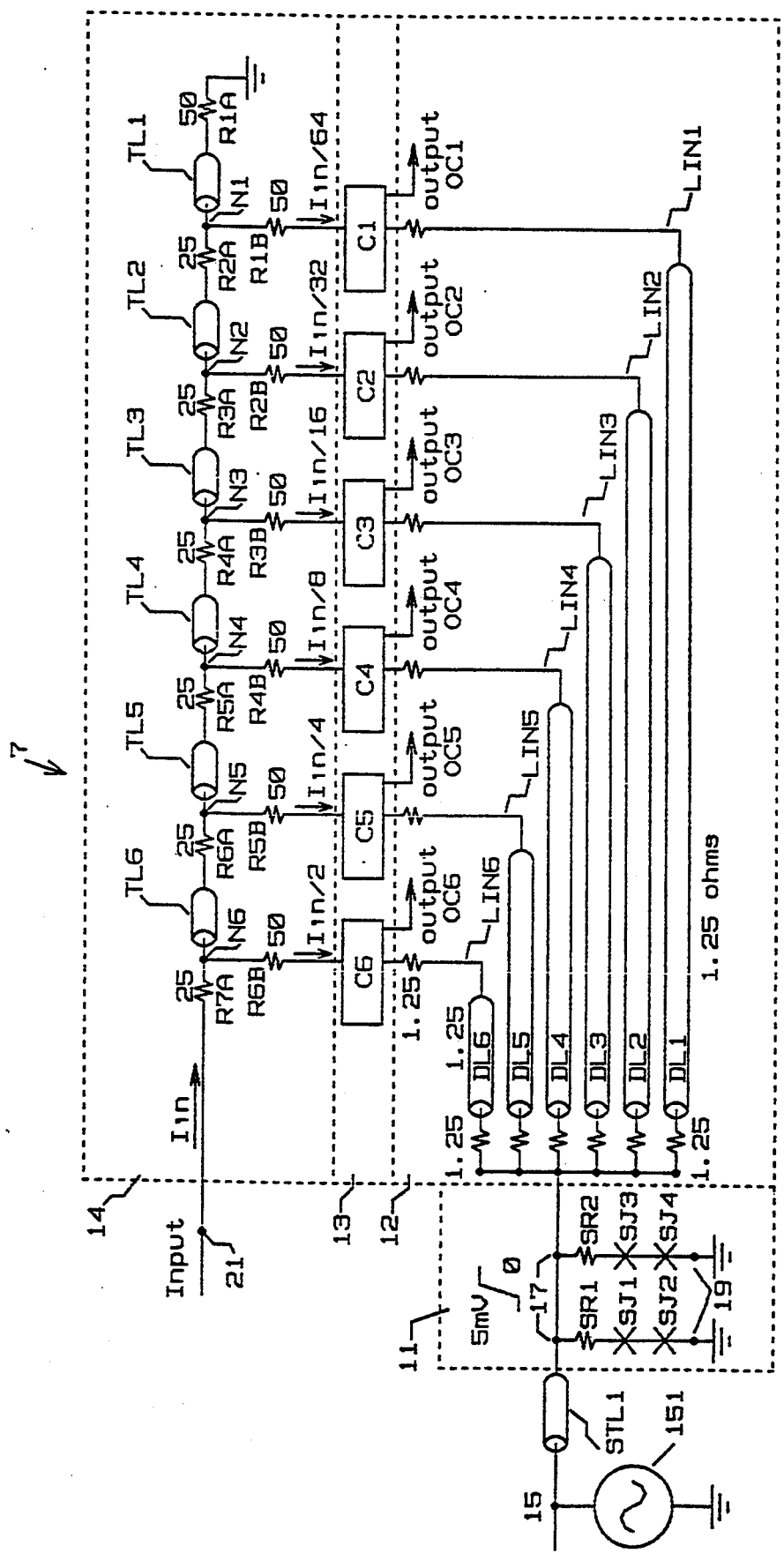
FIG. 3 is a partial schematic partial block diagram of a flash A/D converter embodying the invention.

Referring to FIG. 3, there is shown a 6-bit flash A/D converter 7 comprising a step generator, 11, for producing a sampling step, a sampling distribution section 12, a comparator section 13 composed of six (6) comparators and a resistive ladder network 14. The distribution network 12 couples and distributes the sampling step to the comparators C1 through C6 and the resistive ladder network 14 couples and distributes and input signal applied to terminal 21 to the comparators (C1 through C6) of the circuit. The distribution network 12 provides different delays for the step signal applied to the comparators to compensate for differences in the signal propagation times along the ladder network to the different comparators. This enables the production of outputs from the comparators as if the signal and the step signal arrived at the same time at all comparators.

Figure 1:
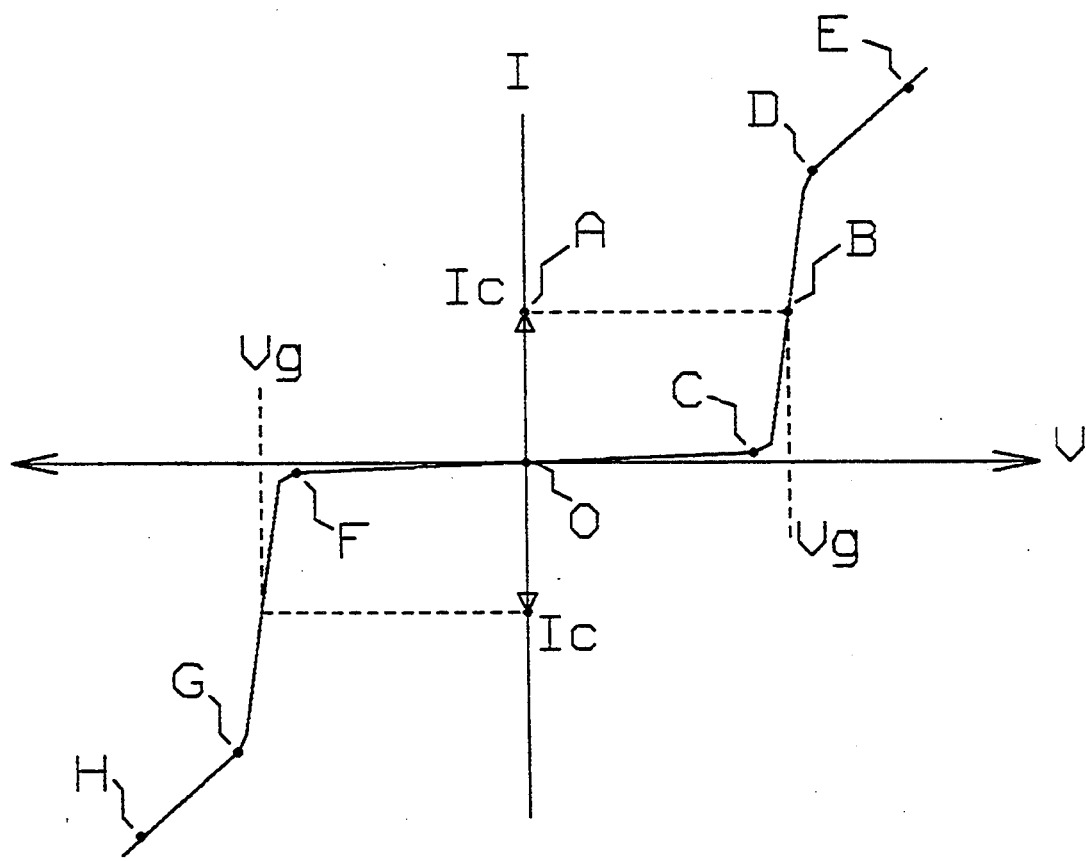
FIG. 1 is a simplified current-voltage (I-V) characteristic of a typical Josephson junction.

In circuits embodying the invention the step generator 11 and the comparator section 13 are preferably formed on the same substrate (i.e., on the same chip). In FIG. 3, the step generator 11 includes an input terminal 15 to which is applied an externally applied driving signal from a source 151. The driving signal is used to supply power and timing information to the comparator section 13. The magnitude and shape of the driving signal is not critical except that it must supply enough current to switch the step generator circuit 11 and have low jitter and/or phase noise. The driving signal applied to the terminal 15 is coupled via transmission line STL1 to node 17. The step generator 11 of FIG. 1 includes two parallel strings connected between node 17 and ground. Each one of the two parallel strings includes a resistor (SR1 or SR2) connected in series with two Josephson junctions ( SJ1, SJ2, or SJ3, SJ4 ). That is one string includes SR1, SJ1 and SJ2 connected in series between node 17 and ground and the other string includes SR2, SJ3, and SJ4 connected in series between node 17 and ground.

In a particular circuit R1 and R2 were made to have an impedance of 0.03 ohms and the critical current of SJ1, SJ2, SJ3 and SJ4 was 8 milliamperes (ma). So designed this step generator is a two gap version scaled to drive an impedance of about 0.4 ohms. In the step generator 11 of FIG. 1, the bias current is increased by increasing the amplitude of the signal applied to terminal 15 until the step generator 11 switches and produces a voltage step at node 17. In a particular embodiment the voltage step has an amplitude of 5 millivolts and a rise time ranging between 5 and 10 picoseconds (ps). Increasing the bias current until the generator switches, instead of applying a separate trigger, means that there is a very large margin on the externally applied driving signal because the step generator 11 also acts as a regulator limiting the output at node 17 to two gap voltages (i.e., 5 millivolts). This also means that the step generator can supply a much larger fraction of the bias current to the load since the bias is close to one hundred percent of the critical current when switching occurs.

In the circuit of FIG. 3, for the component values indicated, when the step generator switches (e.g., from 0 volts to 5 millivolts) it supplies approximately 2 milliamperes (ma) to each of six delay lines (LIN 1 through LIN 6) connected in common to node 17. In a particular embodiment, the impedance of each of these six lines was selected to be 1.25 ohms and they were terminated with a 1.25 ohm resistor at each end of each transmission line to produce a 2.5 ohm load per line at the step generator and at their corresponding comparator. As noted, the length of each line in distributor network 12 is designed to compensate for the different signal delays to the comparators.

Thus, in circuits embodying the invention, clock generator 151 provides both power and timing to the chip. Aside from low jitter, the only requirements on the clock are that the current exceed a threshold value of about 14 mA to trigger on-chip step generator 11 and that it return to zero to reset the step generator. There are no requirements on harmonic distortion or the exact amplitude of the clock. The step generator 11 behaves as a voltage source whose output switches from zero to 5 mV as a function of the clock 151 signal. As the clock current rises, one of the four Josephson junctions in a first branch will switch first, quickly shifting all the current into the second branch, causing both junctions in the second branch to switch to the voltage state. This will cause the current to shift back to the first branch switching the remaining junction to the voltage state and producing the 5 mV step. As noted above, the rise time of the step is 5 to 10 picoseconds. In FIG. 3, the step is shown distributed to 6 comparators via 6 different delay lines to compensate for the differences in the signal propagation times to the different comparators.

The resistive ladder network 14 of the A/D converter includes an input terminal 21 to which applied an analog input signal (IIN or VIN) whose amplitude is to be converted to a digital signal. The input terminal 21 is connected to an input resistor ladder network which distributes the input current (IIN) to the comparators (C1 through C6) of the converter.

Figure 5:
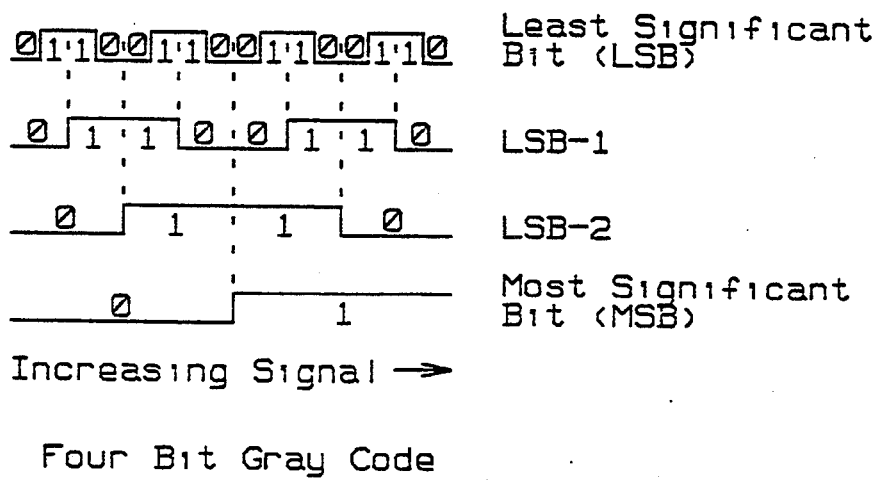
FIG. 5 is a digital representation of a "Gray" code produced at the output of the comparators in a 4-bit A/D converter embodying the invention.

In order to produce a digital output which is an unambiguous representation of the analog input, a "Gray" code is used since in the "Gray" code only one digital output changes when a threshold is crossed. The digital outputs for each of four comparators in a Gray code for a 4-bit A/D converter formed in accordance with the invention is shown in FIG. 5. This avoids potentially large errors that would occur with a different binary code in which two or more bits would be required to change at the same point and time. The Gray code is easily produced with periodic comparators so long as the amount of analog input signal fed to each succeeding comparator is one-half the signal fed or applied to each preceding comparator. This is achieved by means of resistive ladder network 14 of the type shown in FIG. 3.

Referring back to network 14 of FIG. 3, note that resistive ladder network 14 includes the series connection of six 25 ohms resistors (R2A through R7A), five transmission lines TL2 through TL6, and a 50 ohm terminating resistor R1A connected between a node N1 and ground 19 whereby ladder network 14 is effectively connected in series between input terminal 21 and ground terminal 19. FIG. 3 shows nodes N6 through N1 formed at one end of each resistor R7A through R2A. As part of the ladder network, a 50 ohm resistor is connected between each one of nodes N1 through N6 and a comparator input. That is, resistors R6B through R1B are connected between each like numbered node (N6 through N1) and the input of a similarly numbered comparator (C6 through C1).

The resistive ladder network 14 ensures that the current fed to each succeeding comparator (in succeeding order) is one half the current fed to the previous comparator. Thus for a given IIN, one-half IIN (IIN/2) flows into comparator C6, IIN/4 flows into comparator C5, IIN/8 flows into comparator C4, IIN/16 flows into comparator C3, IIN/32 flows into comparator C2 and IIN/64 flows into comparator C1.

For the particular values selected the signal input impedance is 50 ohms. By making the resistors physically large (25 and 50 ohms), resistor matching is improved and thermal stability is improved by spreading heat dissipation over a larger area.

The effect of heating is particularly important since a signal dependent change in critical currents of 1% would be unacceptable in the most significant bit (MSB) comparator. In this design, the MSB comparators (e.g. C1, C2) which are most sensitive to the heating are physically placed furthest away from most of the heat generated by the larger currents in the resistive divider. The comparators (e.g., C6 and C5) for determining the least significant bit conduct the largest currents (e.g. IIN/2, IIN/4), whereby heat dissipation problems and errors are minimized in the LSB stages. Another benefit is that since the comparators (C1-C6) are edge-triggered, only the matching of critical currents is required. By placing junctions in the sampler portion of each comparator close to each other they are held close to the same temperature.

To obtain maximum bandwidth, large RC time constants and impedance discontinuities in the divider network 14 must be avoided. Resistors have capacitance and inductance, but these may be modeled as transmission lines separating the resistors, when reactive components are properly chosen, these may be matched out and they do not introduce distortions at input frequencies. The point is that the divider network 14 is designed so that each node of the network is terminated in its characteristic impedance, whereby there are very little, if any, reflections along the line.

Figure 4:
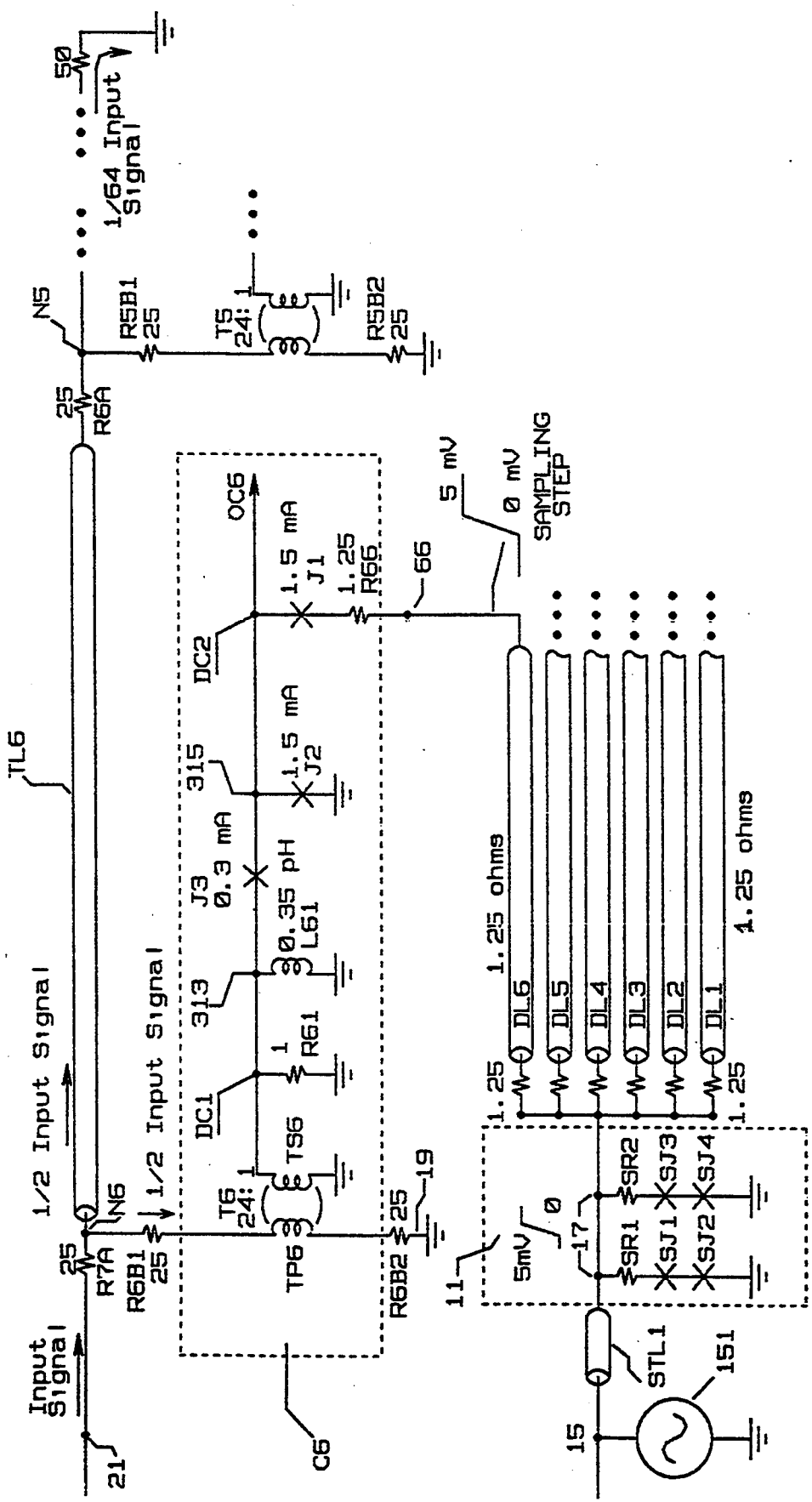
FIG. 4 is a schematic diagram of a portion of the A/D detailing a comparator circuit in accordance with the invention.
Figure 6:
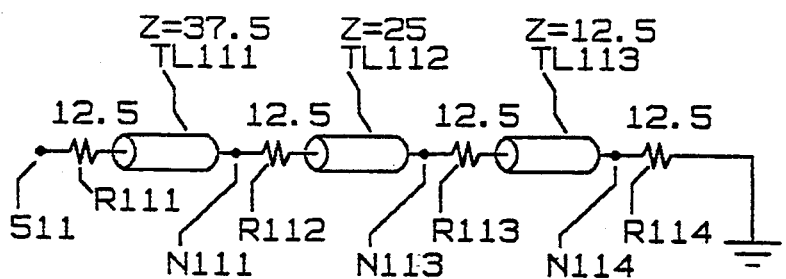
FIG. 6 is a model of a distributed 50 ohm resistor useable in the circuit of FIG. 3.

The resistive component (e.g., R6B) connecting each node (e.g., N6) to its corresponding comparator (e.g. C6) may be formed of and include several separate resistors and the primary of a transformer as shown in FIG. 4. Furthermore, as shown in FIG. 6, by carefully choosing the transmission line impedances, no reflections will be produced at any frequency between the nodes along ladder network 14 and the comparators. Referring to FIG. 6, a signal entering the network at node 511 experiences a 50 ohm impedance because the 12.5 ohm resistor R111 plus the 37.5 ohm transmission line TL111 results in an impedance of 50 ohm. The 37.5 ohm line TL111 is properly terminated by a 12.5 ohm resistor R1112 and the 25 ohm line TL1112 and so on. This model of a distributed resistor with controlled impedance has no upper limit to the bandwidth of signals it will transmit, but there is a time delay. Referring to FIG. 4, note that the path coupling the input signal from node N6 into comparator C6 includes a resistor R6B1 connected at one end to node 6 and at its other end to one end of the primary TP6 of a superconductive transformer T6. The other end of TP6 is connected to one end of the resistor R6B2 whose other end is returned to reference or ground potential 19. In practice, resistors R6B1 and R6B2 may be formed of a resistor and a transmission line to produce a network as shown in FIG. 6. Each node (N1 through N6) of ladder network 14 has a similar network to the one just described to supply or couple the input signal to its corresponding comparator.

The transformer primary (as shown for example by TP6 in FIG. 4) has an average impedance which allows it to be treated as a transmission line, at least up to frequencies of many GHz. If it is inserted into the distributed resistor network at the proper point it should not introduce any significant distortions to the input signal at frequencies of interest. Because of the time of flight in the distributed resistors there is skew in the signal arrival time between comparators. To compensate for the skew or the delay, the sampling step supplied to the comparators is designed to have the same skew to avoid timing problems. Although the comparators are not sampled at the same time, they are sampled at equivalent times since the signal delay is approximately equal to the (sampling signal) delay.

The design of the transformer T6 is important. To take advantage of the transformer, it is preferable that it have a high turns ratio for high current gain. However, there is a requirement that there be good coupling from dc to many GHz on this transformer so the primary may not be made arbitrarily long. When the time-off-light of the signal through the primary is exactly one period of the input signal, a null in the coupling of a sine wave through the transformer is expected. The coupling as a function of frequency is expected to vary roughly as sinX/X where the first null occurs for the conditions described above. In practice, to maintain a short time delay while still obtaining a turns ratio, four small transformers were arranged in a circular pattern so only a small fraction of the primary was not coupled to one of the secondaries. These four secondaries were wired in parallel to increase the current gain. This is effective as long as these four mutual inductances in parallel are larger than the load and parasitic inductance from interconnections. Advantageously, the load is less than 1 pH so the secondary inductor need not be physically large if ground plane holes are used to obtain larger inductances. In one embodiment, the entire transformer had six wraps of primary on each of four secondaries for a turns ratio of 24:1 and including the comparator at its centers, occupied about 100 micrometers × 100 micrometers.

Description of the Comparator Circuit

A comparator circuit (e.g., LSB comparator C6) useful in circuits embodying the invention is shown in FIG. 4. Referring to FIG. 4, there is shown a 25 ohm resistor R7A connected between signal input node 21 and a node N6. A first resistor, R6B1, the primary, TP6, of the superconductive transformer T6 and a second resistor, R6B2, are connected in series between node N6 and ground terminal 19. In the particular embodiment shown in FIG. 4, resistors R7A, R6B1 and R6B2 each have a value of 25 ohms. Transformer T6 has a turns ratio of 24 to 1 to provide very high current gain. Transformer T6 is a superconducting transformer used to amplify the input current by about 20 times and to improve the dynamic range and sensitivity of the analog-to-digital converter (ADC). Since the superconducting transformer is dc coupled, the only constraint it imposes is an upper cutoff frequency limiting the input bandwidth of the ADC.

The transformer impedance is important because it must be embedded in an R/2R resistor divider network and any unmatched capacitance or inductance would cause reflections and improper current splitting at high frequency. This is avoided by treating the transformer primary as a piece of transmission line and inserting it at a point where it will be properly terminated so as to avoid any effect other than a time delay. Because the resistors of the divider ladder must be physically large to obtain good resistance matching and dissipate power, their parasitic reactive components must also be carefully controlled to avoid reflections.

The secondary winding TS6 of transformer T6 is connected between node 313 and ground. A damping resistor R61 is connected across the secondary winding TS6. Also, connected across the secondary winding is an inductor L61. In the circuit of FIG. 4, R61 is shown to have a value of 1 ohms and L61 a value of 0.35 picohenries (pH). A Josephson junction J3, which forms a single junction superconducting quantum interference device (SQUID), is connected between node 313 and a node 315 which also defines the output point OC6 of the comparator circuit (C6). By way of example, the critical current of J3 is shown to be 0.3 milliamperes. The inductor L61 is part of the SQUID and determines the period of the input signals through the SQUID.

The comparator circuit (C6) includes a terminal 66 at which is applied a sampling step from step generator 11. A resistor R66 (having a value of 1.25 ohms) is connected in series with a Josephson junction J1 between node 66 and node 315 and a Josephson junction J2 is connected between node 315 and ground terminal 19. J1 and J2 form an edge triggered sampler circuit, with each one of J1 and J2 having, by way of example, a critical current of 1.5 milliamperes.

The single junction SQUID J3 provides a current through its junction which is a periodic function of the bias current flowing through the junction (J3). The bias current flowing into the SQUID is the input signal (e.g. IIN/2) transformed by T6 (i.e. divided by a power of two). The bias current flowing through junction J3 is injected into node 315 which is formed between the two junctions J1 and J2 and goes to ground via J2. Thus J3, J2 and L61 define a superconducting loop.

Figure 2A:
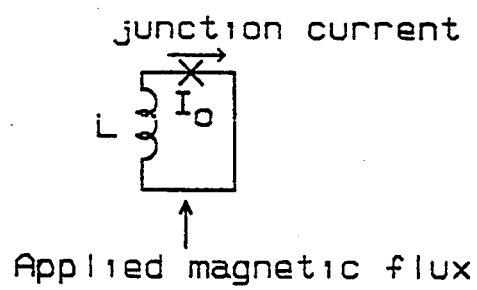
FIG. 2A is an idealized schematic representation of a single junction SQUID.
Figure 2B:
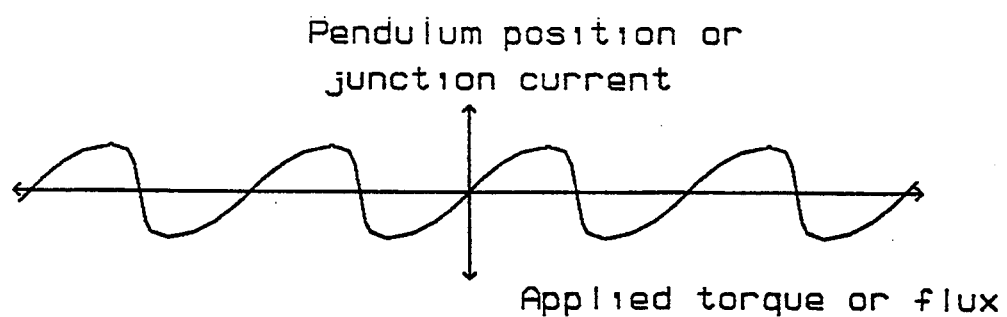
FIG. 2B is a waveform diagram of the periodic transfer function of a single junction SQUID.

The current in a superconducting loop will take on only a discrete set of values such that the magnetic flux contained within the loop is a multiple of the flux quantum ($\phi_0 = h/2e$, which is approximately equal to 2.07 picohenry-milliamperes). This flux quantization arises from the fact that the electrons in a superconducting solid may be described by a single coherent macroscopic wave function whose phase must be single valued. Therefore, the change in the phase around the superconducting loop must be multiple of $2\pi$; hence only certain values of current are possible. If $LI_0 < \phi_0/2\pi$, where L is the loop inductance and $I_0$ is the critical current of a junction in the loop, the flux is no longer strictly quantized in units of $\phi_0$ because the junction will not support enough supercurrent. However, the loop current does adjust itself to a unique value that brings the loop flux closer to a multiple of $\phi_0$ than would otherwise be the case. This current is approximately a sinusoidal function of the magnetic flux as shown in FIG. 2B and when it is digitally sampled to determine its polarity may be used as one bit of the ADC output. The periodic nature of the comparator allows the use of the same device for a large number of thresholds of the ADC. Moreover, because the periodicity is equal to h/2e. L, which is approximately equal to 2.07 pH-mA divided by L, where L is the loop inductance, a highly linear ADC is possible. This effect forms the basis for the ADC embodying the invention which uses only N comparators for N bits of resolution.

At low frequencies the junction, J1, J2 and J3, act as a short circuit until their critical current is exceeded. When that occurs, each junction switches to a value assumed to be 2.5 millivolts (but which could also be somewhat higher). The transformer supplied signal current injected into J3 produces either a positive or negative current into the node 315 between J1 and J2.

When the sampling step rises, J2 or J1 will switch if the current is positive or negative ("1" or "0"). When the current in J3 is at or close to zero, the sampling step may cause both J1 and J2 to switch, which condition is treated as a logic "1". The output OC6 of the comparator varies periodically with the input signal current and is used as the mechanism to encode the analog input signal into a digital form.

Note that the single junction SQUID J3 provides a current through its junction (in accordance with FIG. 2B) which is a periodic function of the bias current (i.e. the input signal multiplied by the constant multiplier current of the transformer). The bias (i.e. signal) current is injected between the two junctions (J1 and J2) of the sampler network and flows to ground. When the fast 5 mV amplitude sampling signal arrives, the sampler circuit (i.e. J1 and J2) switches to one of three possible states. Either J2 (the bottom junction) switches, J1 (the top junction) switches or they both switch.

If the J3 current is a large positive current, J2 switches and the condition is arbitrarily defined as the logic "1" condition. If the J3 is a large negative current, J1 switches and this condition is arbitrarily defined as a logic "0" condition. If the J3 current is at or close to zero, J1 and J2 may both switch, which condition is also arbitrarily defined as a logic "1" condition. The range of currents causing the sampler to switch both junctions depends on the clock rise time, the capacitance shunting the junctions and the load seen by the junctions. Regardless of whether the top junction switches, any time the bottom junction switches, it is considered a logic "1" since the output is sensed at the node between these junctions. Special care must be taken during layout of the comparator to minimize the parasitic inductance of the superconducting loop formed by the single junction SQUID and the bottom sampling junction.

The non-parasitic part of the single junction SQUID inductance determines the periodicity of the comparator (period = $\phi_0/L$) and hence, the signal current necessary for full scale operation ($\pm 8$ full periods are needed for a 6-bit converter). To obtain high sensitivity and limit power dissipation in the input resistor divider network, it is preferable to make L large. On the other hand, to make the comparator fast and less susceptible to noise, it is preferable to make the small junction J3 a minimum-sized junction with the maximum possible current density. A relatively painless resolution of these three constraints (small $LI_o$, large L, large $I_o$) is to use a high bandwidth, high current gain transformer (e.g. T6) to couple the input signal to each comparator. This allows the input signal level to be kept low and to simultaneously make the non-parasitic part of the SQUID inductance small. The smaller the total SQUID inductance is made., the higher the current density that may be used for the minimum-sized junction. This translates to higher speed operation. [4000A/cm$^2$ has been used in this circuit.] It should also be noted that the exact value of the small junction J3 is not critical since it is only the sign of the current it injects into the sampler node 315, not its amplitude, which is being measured.

It should therefore be evident that the comparator performs three functions. The first function of the comparator results from the periodic transfer function of the SQUID which produces a circulating current periodic in the input signal whose polarity depends on whether the nearest multiple of a flux quantum is above or below the actual magnetic flux in the loop. The second function of the comparator is to perform a high speed digital sampling of the polarity of this circulating current. This is achieved by two Josephson junction (J1, J2) connected in series between a sampling step terminal 66 and ground potential. The circulating loop current is injected between the two Josephson junctions J1, J2 connected in common at node 315. The other end of junction J2 is grounded and the other end of junction J1 is connected to a low impedance clock terminal 66 at which is produced a voltage sampling step which rises from 0 to 5 mV in 5 to 10 picoseconds. The two junctions (J1, J2) are designed to have the same critical current so that a clockwise circulating current will add to the clock current in junction J2 causing it to switch from the superconductive ("S") state to the voltage state (approximately 2.5 mV). A counter clockwise current will subtract from the clock current in junction J2 causing junction J1 to exceed its critical current before junction J2 can switch state. Since the clock is a low impedance source, this reduces the clock current to a level below that necessary to switch junction J2 and it remains in the zero voltage state. The third function of the comparator is to supply an output voltage from between these sampling junctions (i.e., node 315) which will be about 2.5 mV in the first case (i.e., for clockwise circulating current) and 0mV in the second case (i.e., for counter clockwise circulating current). This digital output (0 volts or 2.5 mV) is used directly as one of the N bits of a Gray-coded binary output of the ADC.

A Gray code is easily generated by N identical comparators, each receiving half as much input signal as the preceding one. To correct threshold variation due to unmatched critical currents in the sampler, means (not shown) are provided to inject a dc offset into the output node of each comparator. A second dc bias current (also not shown) is used to shift all thresholds of a comparator up or down relative to zero of the input signal to enable the generation of the Gray code.

Figure 7:
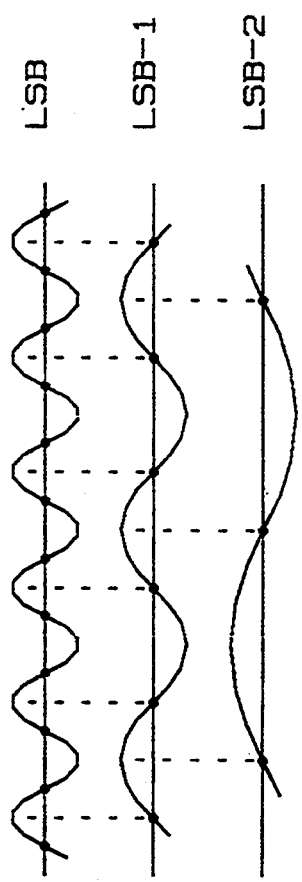
FIG. 7 is a diagram showing the shift of the transfer function of succeeding comparators relative to each other in an A/D converter embodying the invention.

For each comparator there are two dc adjustments, DC1 and DC2, of the flux bias and reference level as shown in FIG. 4. The first adjustment DC1 used for the adjustment of flux bias, is a current injected at the secondary of the transformer to shift the transfer function of the comparator. The effect of the shift is shown by way of example in FIG. 7 which shows how the transfer functions of the J3 junctions in succeeding comparators would be shifted relative to each other. Recall that the shiftings and the resistive ladder network enable the production of the Gray code type output shown in FIG. 5. The second adjustment, DC2, is a current injected into the node 315 between the sampling junctions to adjust the duty cycle to achieve a 50% duty cycle of the transfer function (see FIG. 5). If the resistive divider 14 is accurate, these adjustments allow all the thresholds to be adjusted for sufficient accuracy. In a 6-bit converter, it is ultimately possible to eliminate almost all the reference currents if critical currents can be accurately matched in processing.

Figure 8:
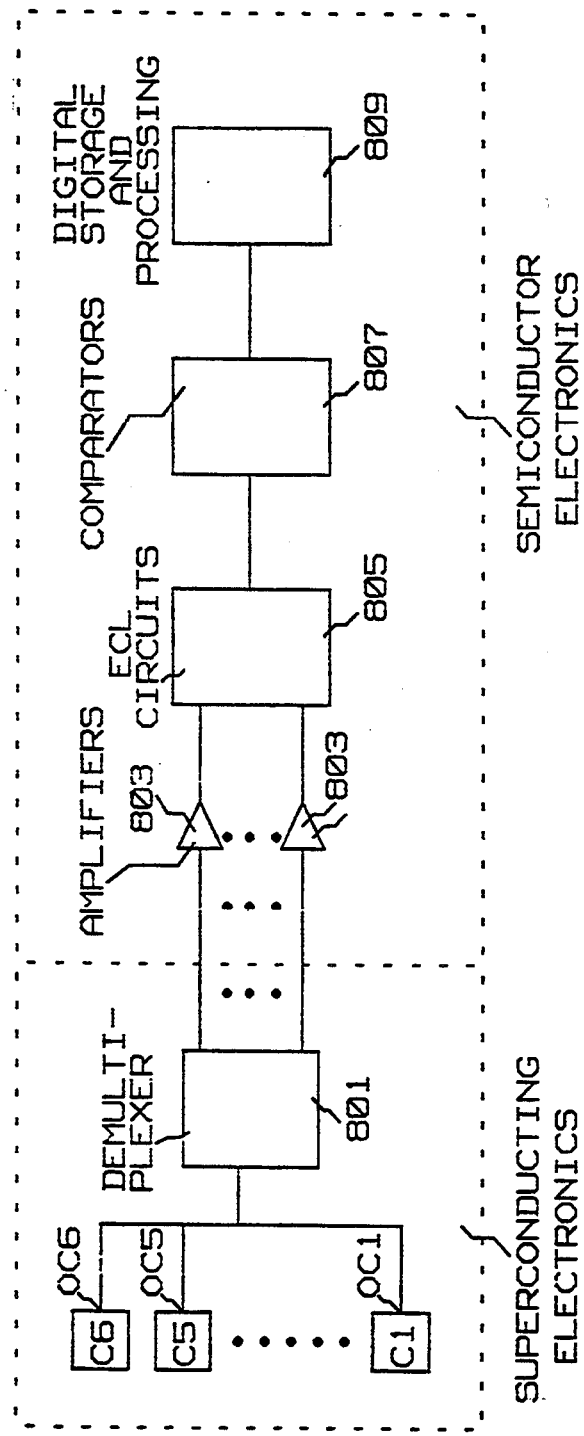
FIG. 8 is a block diagram of output circuitry useful with an A/D converter of the invention.

The output nodes (OC1, OC2, . . . OC6) of the comparators are loaded with 20 ohm transmission lines and matched to the 50 ohm sample holder lines at the pads to avoid reflections and long time constants due to charging the line capacitance. Some versions designed have edge-triggered output latches near the comparator which may be clocked at a subharmonic of the main clock to allow acquisition of individual samples (maybe one out of 100) for digital processing. The outputs of the comparators may be coupled to superconducting demultiplexing circuitry and then via standard semiconductor electronic circuitry including amplifier means and high speed circuits (such as ECL type gates) for coupling to digital storage or further signal processing, as shown in FIG. 8. That is, FIG. 8 shows the outputs (OC1 . . . OC6) of the comparators being coupled to the inputs of a demultiplexer 801 comprised of superconducting electronic components. The outputs of the demultiplexer 801 which tend to be in the range of millivolts are coupled to amplifiers (803) made of semiconductor material whose outputs are applied to high speed semiconductor circuitry (such as ECL logic and circuits) 803. The outputs of the high speed circuit 803 are then coupled to semiconductor comparator circuitry 807 whose outputs are coupled to semiconductor digital storage and processing circuit 809.

What is claimed is:

1. A comparator circuit comprising:
   an input terminal adapted to receive an input signal;
   a first Josephson junction connected between a first node and an output node;
   inductive means coupled between said input terminal and said first node responsive to the input signal for supplying a current through said first Josephson junction which goes positive and negative about a reference level with a periodicity which is a function of the inductance of the loop and the amplitude of the input signal; said current, when positive relative to the reference level, defining one binary condition and, when negative relative to the reference level, defining the other binary condition; and
   sampling means coupled to said output node for ascertaining the binary condition of the signal produced at said output node comprising:
   a) a sampling terminal for the application thereto of a sampling pulse;
   b) a second Josephson junction coupled between said sampling terminal and said output node; and
   c) a third Josephson junction connected between the output node and a first point adapted to receive a reference potential.

2. The comparator as claimed in claim 1, wherein said inductive means coupled between said input terminal and said first node includes:
   a) a transformer having a primary winding and a secondary winding with said primary winding being coupled between said input terminal and a reference potential;
   b) a resistor and an inductor being coupled in parallel across the secondary winding of said transformer; and
   c) means coupling one end of said secondary winding to said first node and the other end of said secondary winding to said first point adapted to receive a reference potential.

3. The comparator as claimed in claim 2, wherein said sampling means includes:
   a) a clocking terminal adapted to receive a clocking signal;
   b) two parallel paths connected between said clocking terminal and a second point adapted to receive a reference potential, each path including two Josephson junctions and a resistor connected in series; and
   c) means coupling the clocking terminal to said sampling terminal.

4. The comparator circuit as claimed in claim 3 wherein the same reference potential is applied to said first and second points.

5. A comparator circuit comprising:

an input node;

means for applying an input signal to said input node;

a first Josephson junction connected between said input node and an output node;

a sampling terminal for the application thereto of a sampling pulse;

a second Josephson junction connected between said sampling terminal and said output node;

a third Josephson junction connected between said output node and a first point adapted to receive a reference potential; and means for selectively applying a sampling step pulse to said sampling terminal for causing: (a) the second Josephson junction to switch from the superconductive ("S") state to the normal ("N") state in response to a negative signal current through said first junction; and (b) the third Josephson junction to switch from the "S" to the "N" state in response to a positive current through said first junction.

6. The comparator as claimed in claim 5, wherein said means for applying an input signal to said input node includes:

a) a signal input terminal;

b) a transformer having a primary winding and a secondary winding with said primary winding being coupled between said input terminal and a reference potential;

c) a resistor and an inductor being coupled in parallel across the secondary winding of said transformer; and d) means coupling one end of said secondary winding to said input node and the other end of said secondary winding to said first point of reference potential.

7. The comparator as claimed in claim 6, wherein said sampling means includes:

a) a clocking terminal adapted to receive a clocking signal;

b) two parallel paths connected between said clocking terminal and a second point adapted to receive a reference potential, each path including two Josephson junctions and a resistor connected in series; and c) means coupling the clocking terminal to said sampling terminal.

8. The combination as claimed in claim 5 wherein the critical current of said first Josephson junction is significantly less than the critical currents of said second and third Josephson junctions.

9. The combination as claimed in claim 5 wherein the sampling means are formed on the same substrate as the comparators.

10. The comparator circuit as claimed in claim 7 wherein the same reference potential is applied to said first and second points.

11. An analog to-digital converter (ADC) comprising:

an input terminal adapted to receive an input signal;

a ladder network connected between said input terminal and a reference point, said ladder network having N nodes spaced sequentially along the ladder network, where N is an integer greater than 1, the ladder network being arranged to produce a current at each subsequent one of said N nodes which is one half the current at the preceding node;

N comparator circuits, one comparator per each one of said N nodes, each comparator having an input node, a sampling node and an output node at which is produced a signal which is indicative of whether a signal at its input node has a first or second binary value; each comparator including a first Josephson junction coupled between the input node and the output node, a second Josephson junction coupled between the sampling node and said output node, and a third Josephson junction coupled between said output node and a point adapted to receive a reference potential;

means coupling the input node of each comparator to a corresponding one of said N nodes; and means for applying a sampling signal to each one of said sampling nodes of said N comparators.

12. The analog to digital converter of claim 11, wherein each means coupling the input node of a comparator to its corresponding one of said N nodes includes:

a) a transformer having a primary and a secondary with the primary of the transformer being coupled to its corresponding one of said N nodes; and the secondary being connected between said input node and said point adapted to receive a reference potential; and b) an inductor connected in parallel across the secondary of the transformer.

13. The analog to digital converter according to claim 12 wherein the means for applying a sampling signal to each one of said sampling nodes of said N comparators includes:

a) a clocking generator for producing a sampling pulse at a clocking terminal; and b) a delay line connected between each sampling node of each comparator and said clocking terminal.

14. The analog-to-digital converter according to claim 13 wherein the clocking generator includes:

a) a clocking terminal adapted to receive a clocking signal;

b) two parallel paths connected between said clocking terminal and a point adapted to receive a reference potential, each path including two Josephson junctions and a resistor connected in series; and c) means coupling the clocking terminal to said sampling terminal.

15. The combination as claimed in claim 11 wherein said ladder network is terminated in its characteristic impedance and each node along the ladder network is terminated in its characteristic impedance.

* * * * *